(12) United States Patent
Juan et al.

(10) Patent No.: US 10,219,417 B2
(45) Date of Patent: Feb. 26, 2019

(54) ELECTRONIC DEVICE HAVING BLOCKING ELEMENT

(71) Applicant: CORETRONIC CORPORATION, Hsin-Chu (TW)

(72) Inventors: Chen-Tsun Juan, Hsin-Chu (TW); Bor-Bin Chou, Hsin-Chu (TW)

(73) Assignee: CORETRONIC CORPORATION, Hsin-Chu (TW)

( * ) Notice: Subject to any disclaimer, the term of this patent is extended or adjusted under 35 U.S.C. 154(b) by 0 days.

(21) Appl. No.: 15/461,480

(22) Filed: Mar. 17, 2017

(65) Prior Publication Data

US 2017/0290206 A1   Oct. 5, 2017

(30) Foreign Application Priority Data

Mar. 31, 2016   (TW) .............................. 105110282 A (51) Int. Cl.
*H05K 7/20*   (2006.01)
*H05K 5/02*   (2006.01)

(52) U.S. Cl.
CPC ....... *H05K 7/20972* (2013.01); *H05K 5/0213* (2013.01); *H05K 7/20145* (2013.01)

(58) Field of Classification Search
CPC ........... H05K 7/20954; H05K 7/20972; H05K 5/0017; H05K 5/0217; H05K 5/06
USPC ................ 361/695; 313/33, 46, 582; 349/58
See application file for complete search history.

(56) References Cited

U.S. PATENT DOCUMENTS

| | | | | |
|---|---|---|---|---|
| 3,011,422 A * | 12/1961 | Scallon | ................. | F24F 13/075 454/280 |
| 3,245,224 A * | 4/1966 | Wilkinson | ......... | B60H 1/00371 165/128 |
| 3,888,090 A * | 6/1975 | Meyer | ........................ | B63J 2/04 62/217 |
| 5,201,879 A * | 4/1993 | Steele | ..................... | F24F 13/08 174/16.1 |
| 5,243,453 A | 9/1993 | Kawaguchi et al. | | |
| 7,362,570 B2 * | 4/2008 | Su | ........................ | H05K 5/0213 224/673 |
| 7,438,450 B2 * | 10/2008 | Aoki | ................. | G02F 1/133608 362/218 |
| 7,580,258 B2 * | 8/2009 | Tseng | ................. | H05K 7/20972 313/582 |
| 8,223,311 B2 * | 7/2012 | Kim | .................. | G02F 1/133385 349/161 |

(Continued)

FOREIGN PATENT DOCUMENTS

| | | |
|---|---|---|
| CN | 104132397 | 11/2014 |
| CN | 204029311 | 12/2014 |
| TW | 200832022 | 8/2008 |

OTHER PUBLICATIONS

"Office Action of Taiwan Counterpart Application," dated Aug. 8, 2017, p. 1-p. 4, in which the listed references were cited.

*Primary Examiner* — Zachary Pape
(74) *Attorney, Agent, or Firm* — JCIPRNET (57) ABSTRACT

An electronic device including an electronic module, a casing, and at least one air port is provided. The casing accommodates the electronic module. The air port is disposed on the casing to communicate the inside of the box to the outside. The air port includes an inclined blocking element. The inclined blocking element has a plurality of inclined openings, and the inclined openings are inclined relative to a horizontal direction.

11 Claims, 7 Drawing Sheets

(56) References Cited

U.S. PATENT DOCUMENTS

| | | | |
|---|---|---|---|
| 8,976,313 B2* | 3/2015 | Kim | G02F 1/133382 |
| | | | 349/58 |
| 2007/0146989 A1 | 6/2007 | Su | |
| 2010/0149455 A1 | 6/2010 | Tsubokura et al. | |
| 2011/0116016 A1 | 5/2011 | Mikubo et al. | |
| 2012/0223877 A1* | 9/2012 | Cho | G02F 1/133385 |
| | | | 345/102 |
| 2015/0009625 A1* | 1/2015 | Chin | H05K 7/20145 |
| | | | 361/695 |

\* cited by examiner

ELECTRONIC DEVICE HAVING BLOCKING ELEMENT

CROSS-REFERENCE TO RELATED APPLICATION

This application claims the priority benefit of Taiwan application serial no. 105110282, filed on Mar. 31, 2016. The entirety of the above-mentioned patent application is hereby incorporated by reference herein and made a part of this specification.

BACKGROUND OF THE INVENTION

1. Field of the Invention

The invention generally relates to an electronic device, and more particularly, to an electronic device with waterproof function and favorable heat dissipation.

2. Description of Related Art

Because liquid crystal display (LCD) has unique benefits in being thin and lightweight, requiring low power consumption and low operating voltage, and being brightly colourful, with the increasing maturity of its production technology and the large-scale industry development, the LCD has currently become the most popular display equipment. In addition, due to the widely use of outdoor LCD advertising screen, public areas of many cities are all provided with outdoor LCDs.

Due to a variety of weather conditions (raining, snowing or fogging) at the outdoor, outdoor use LCD requires to have a perfect waterproof measure so as to prevent a deterioration of display effect due to rainwater intruding into the LCD and causing oxidation, corrosion or short-circuit. In order to achieve a waterproof effect, the outdoor use LCD is equipped with a metal front frame in combination with glass and a metal back cover, and the aforesaid metal components are adhered together through a double-sided tape or a rubber material so as to be completely isolated from the outside to achieve the waterproof effect.

Although the aforementioned system achieves the waterproof effect, it further causes a difficulty in heat dissipation. If the overall waterproofing system of the LCD produces much heat energy due to a long time operation or overly strong sunlight irradiation, then the heat energy generated is unable to be successfully guided out of the waterproofing system, and thereby causes a reduction in the lifetime of the LCD and a deterioration in the display effect. Furthermore, a great amount of heat energy is generated along with an operation of the conventional large size or high-brightness LCD. Because of the aforementioned problem in heat dissipation, the large size or the high-brightness LCD is not applicable as the outdoor use LCD. In other words, the conventional outdoor use LCD is grounded with a small size design due to the problem in heat dissipation. Based on the above, how to resolve the above problems is substantially one of the current focuses for those skilled in the art.

The information disclosed in the "BACKGROUND OF THE INVENTION" section is only for enhancement of understanding of the background of the described technology, and therefore it may contain information that does not form the prior art that is already known to a person of ordinary skill in the art. Further, the information disclosed in the "BACKGROUND OF THE INVENTION" section does not mean that one or more problems to be resolved by one or more embodiments of the invention was acknowledged by a person of ordinary skill in the art.

SUMMARY OF THE INVENTION

The invention is directed to an electronic device having both a favorable waterproof ability and a favorable heat dissipation ability.

Other objects and advantages of the invention can be further illustrated by the technical features broadly embodied and described as follows.

To achieve one, a part, all of the above objectives or other objectives, an electronic device is provided in an embodiment of the invention provides. The electronic device includes an electronic module, a casing and at least one air port. The casing accommodates the electronic module. The air port is disposed on the casing to communicate the inside of the casing to the outside. The air port includes a first inclined blocking element. The first inclined blocking element has a plurality of first inclined openings, and the first inclined openings incline relative to a horizontal direction.

In view of the above, the above embodiments of the invention may have at least one of the following advantages or effects. Since the electronic device in the above embodiments of the invention has the air port which communicates the inside of the casing to the outside, heat energy generated due to an operation of the display unit or sunlight irradiation can successfully be guided to the outside through the air port, thereby providing a favorable heat dissipation ability. In addition, the inclined openings of the inclined blocking element incline relative to the horizontal direction, and thus, when water droplets enter the electronic device from the outside, the water droplets as being subjected to an effect of gravity can be discharged through the inclined openings along a surface of the inclined blocking element, wherein the water droplets are blocked by the inclined blocking element. As such, the electronic device in the above embodiments of the invention, in addition to having a favorable waterproof ability, further has a favorable heat dissipation ability.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
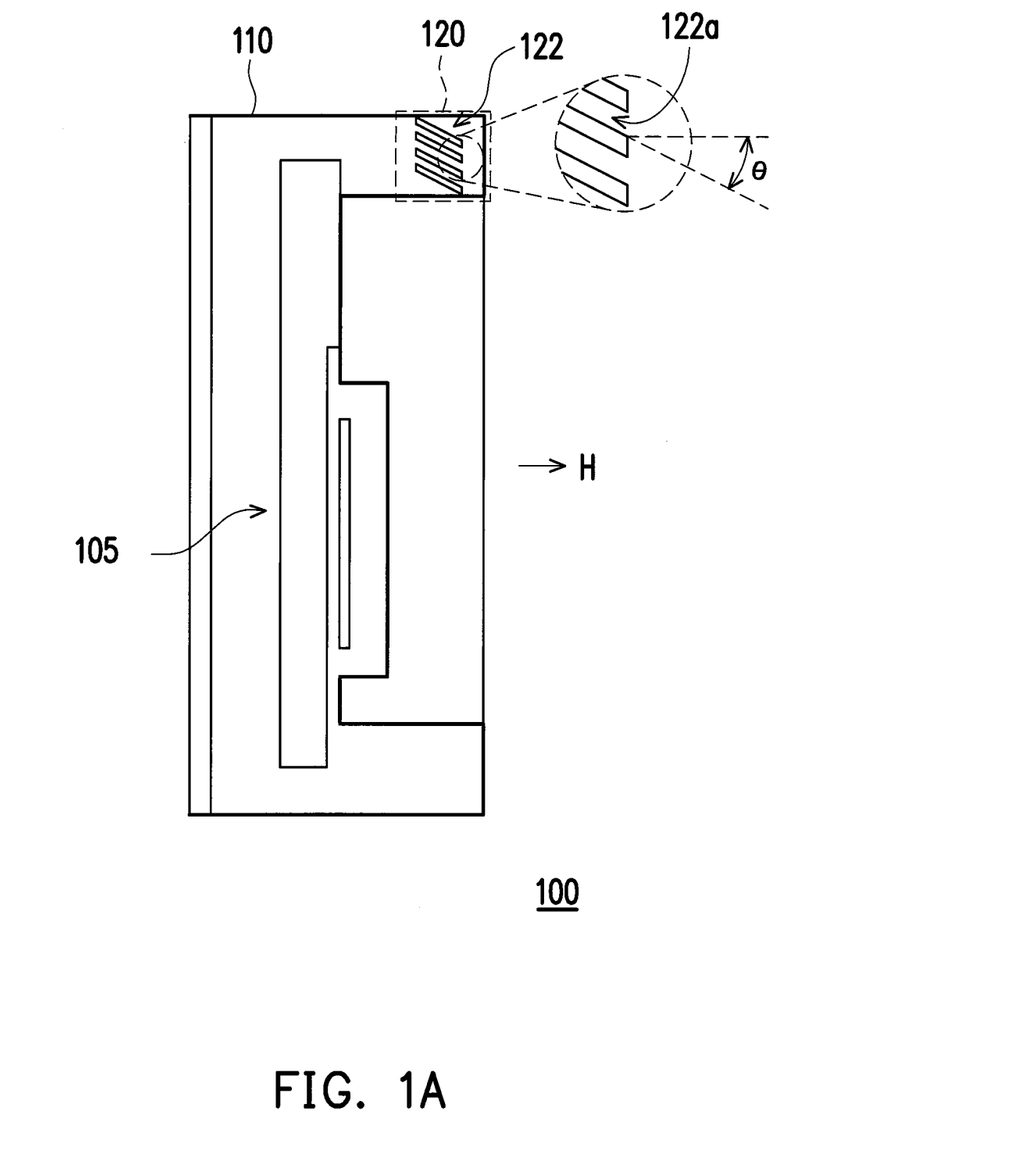
FIG. 1A is a schematic cross-sectional view illustrating an electronic device according to an embodiment of the invention.

Firstly, referring to FIG. 1A. An electronic device 100 of the embodiment includes an electronic module 105, a casing 110 and at least one air port 120. In the embodiment, the air port 120 is disposed on the casing 110 so that the inside of the casing 110 is communicated to the outside. In the embodiment, the air port 120 includes a first inclined blocking element 122, and first inclined blocking element 122 can be constituted by a lamellar structure or a honeycomb structure. In the embodiment, the first inclined blocking element 122 has a plurality of first inclined openings 122a, and the first inclined openings 122a are, for example, inclining relative to a horizontal direction H. In detail, in the embodiment, the first inclined openings 122a are, for example, inclining downwards relative to the horizontal direction H, and a range of an inclination angle θ of the first inclined openings 122 in relation to the horizontal direction H is greater than 0 degree and smaller than 90 degrees. In one embodiment, the range of the inclination angle θ of the first inclined openings 122 in relation to the horizontal direction H is from 30 degrees to 75 degrees, but the invention is not limited thereto. Since the electronic device 100 of the embodiment has the air port 120 and the air port 120 communicates the inside of the casing 110 to the outside, the electronic device 100 of the embodiment can successfully guide the heat generated due to an operation of the electronic module 105 or sunlight irradiation to the outside with the airflow through the air port 120, thereby providing a favorable heat dissipation ability.

Figure 1B:
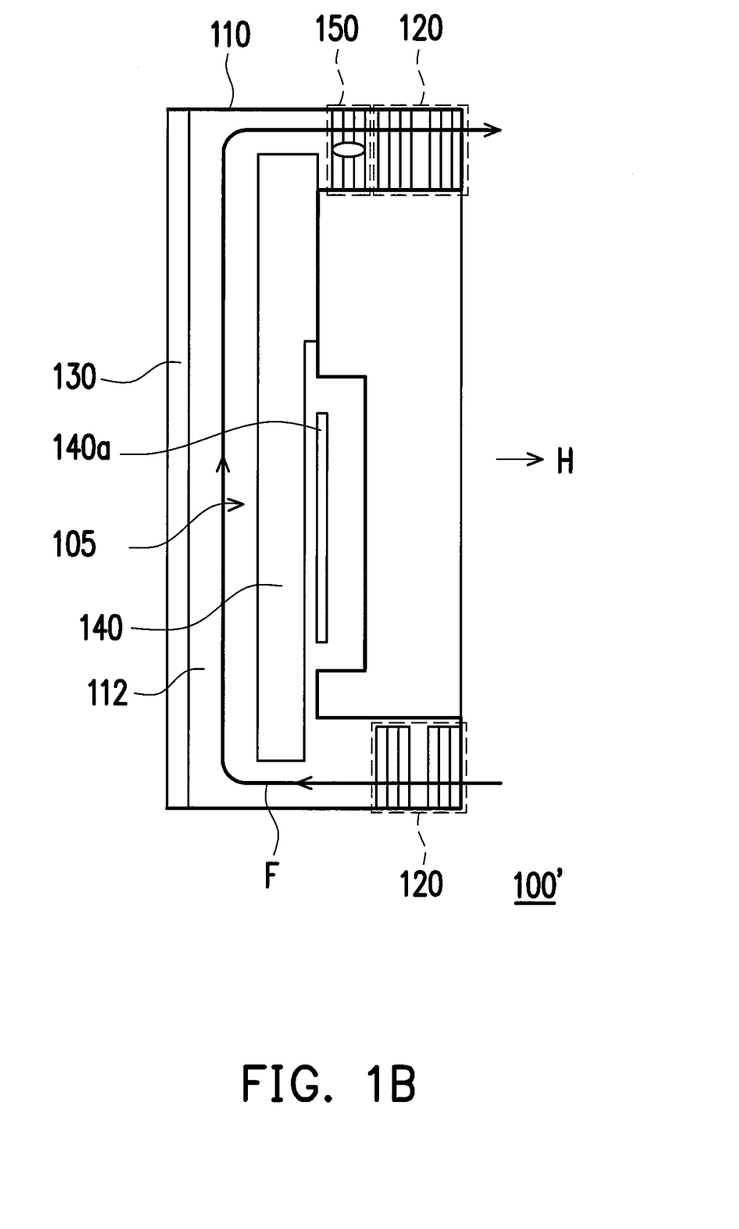
FIG. 1B is a schematic cross-sectional view illustrating an electronic device according to another embodiment of the invention.
Figure 2A:
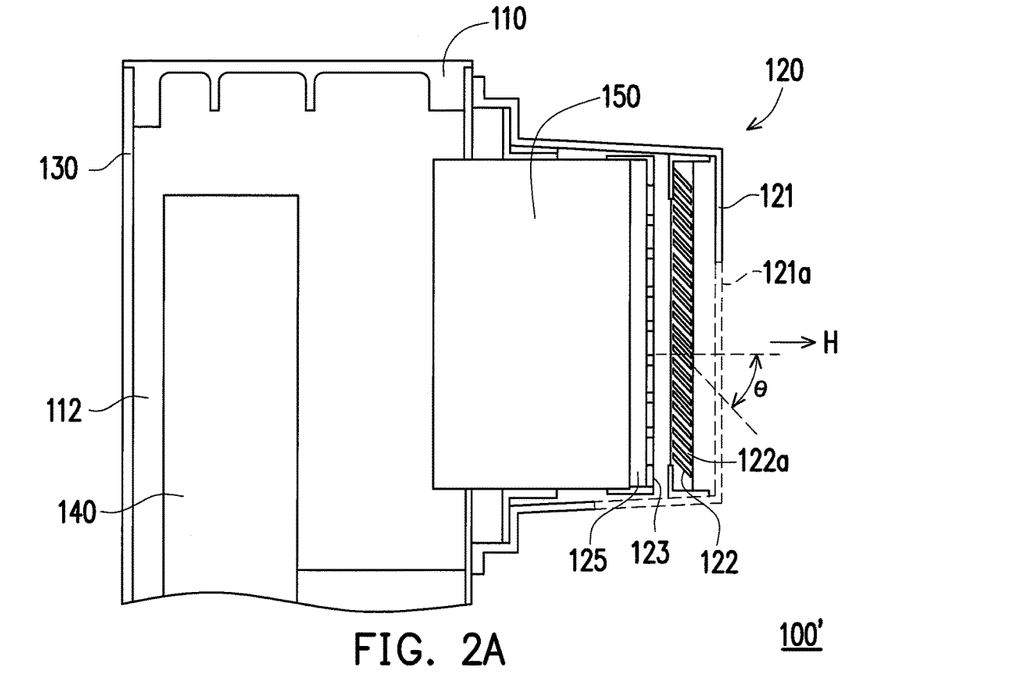
FIG. 2A is a schematic cross-sectional view illustrating a top portion of the electronic device in the embodiment of FIG. 1B.

Referring to FIG. 1B and FIG. 2A, in the embodiment, an electronic device 100' is similar to the electronic device 100 of FIG. 1A. Components and relevant descriptions of the electronic device 100' can be referred to the electronic device 100 of FIG. 1A, and thus will not be repeated. The electronic device 100' of the embodiment further includes a translucent plate 130. In the embodiment, the electronic device 100' is, for example, a display device, and the electronic module 105 is, for example, a display panel. For instance, the electronic module 105 includes a display unit 140 and a circuit board 140a, and the circuit board 140a is electrically connected with the display unit 140. In the electronic module 105 of the embodiment, a controller (not shown) controls the display unit 140 through the circuit board 140a. In the embodiment, the translucent plate 130 is disposed at the casing 110, and the translucent plate 130 is, for example, adhered to the casing 110 through a waterproof double-sided tape. In the embodiment, the display unit 140 is disposed within the casing 110 and configured to produce an image. In the embodiment, the translucent plate 130 is located on a transmission path of the image, and the image is outputted through the translucent plate 130. In the embodiment, the display unit 140 is, for example, a liquid crystal display panel, an organic light emitting diode (OLED) display panel or a light emitting diode (LED) display panel, but the invention is not limited thereto.

Referring to FIG. 1B again, in the embodiment, the casing 110 has a flow channel 112. The flow channel 112 is located inside of the casing 110, and the air port 120 is connected to the flow channel 112. Specifically, the translucent plate 130 and the display unit 140 of the embodiment constitute the flow channel 112, and the flow channel 112 is communicated with the air port 120. In the embodiment, the number of the at least one air port 120 is, for example, a plurality, such as two. In the embodiment of FIG. 1B, the two air ports 120 are respectively disposed at the top of the electronic device 100' and the bottom of the electronic device 100', and the two air ports 120 are respectively connected to the flow channel 112, wherein the two air ports 120 are, for example, respectively connected to two ends of the flow channel 112. In other embodiment not shown, the number of the at least one air port 120 can, for example, be one or more than two, and the invention is not limited thereto.

Figure 2B:
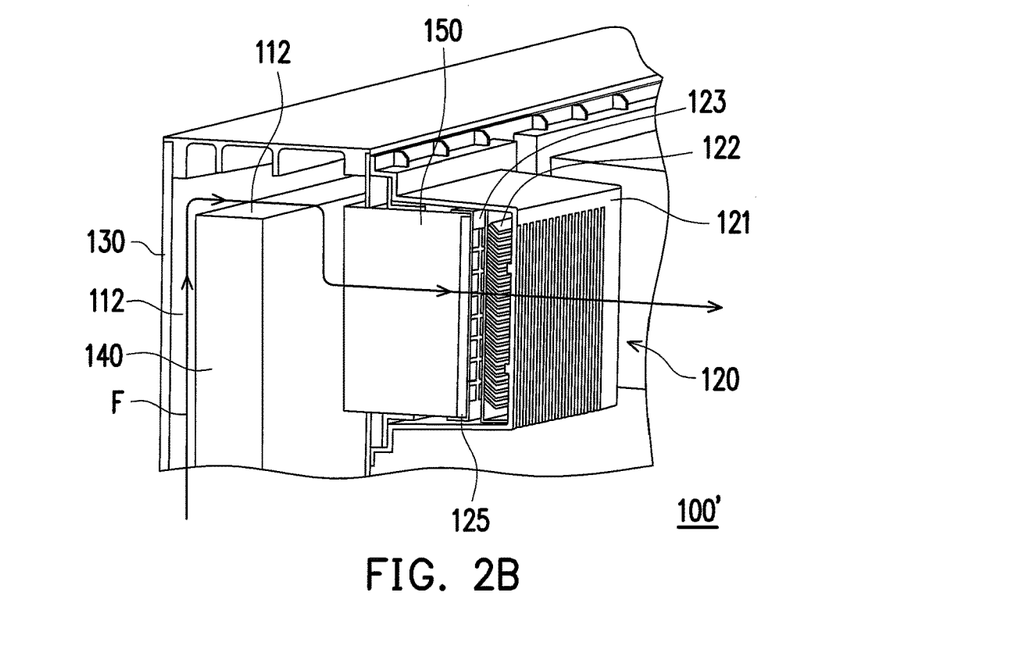
FIG. 2B is a schematic perspective view illustrating the top portion of the electronic device in the embodiment of FIG. 2A.
Figure 2C:
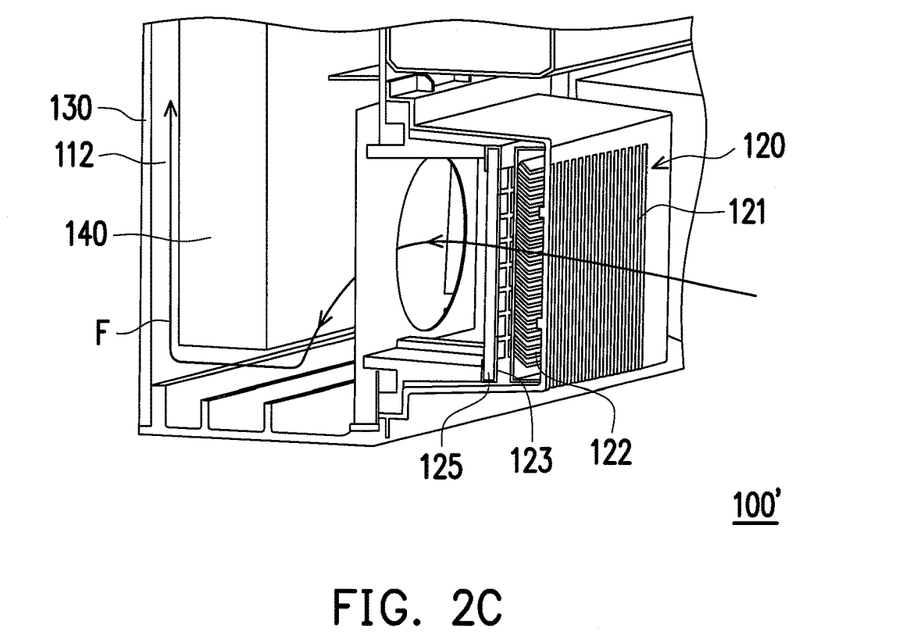
FIG. 2C is a schematic perspective view illustrating a bottom portion of the electronic device in the embodiment of FIG. 2A.

Referring to FIG. 1B, FIG. 2B and FIG. 2C at the same time. Further speaking, in the embodiment, the airflow F between the translucent plate 130 and the display unit 140 performs a heat exchange with the heat generated due to the operation of the display unit 140 or the sunlight irradiation. It can be known from the schematic view of the top portion of the electronic device as illustrated in FIG. 2B, a temperature of the airflow F that underwent the heat exchange is higher, and thus the airflow F that underwent the heat exchange can flow along the flow channel 112 and pass be discharged out of the electronic device 100' through the air port 120 at the top of the electronic device 100'; at the same time, an air pressure in the flow channel 112 between the translucent plate 130 and the display unit 140 is lowered due to the airflow F that underwent the heat exchange being discharged out of the electronic device 100', and the flow channel 112 between the translucent plate 130 and the display unit 140 has a pressure difference with the external environment. It can be known from the schematic view of the bottom portion of the electronic device as illustrated in FIG. 2C, through this pressure difference, the airflow F having the lower temperature enters the electronic device 100' through the air port 120 at the bottom of the electronic device 100'. Briefly, as shown in FIG. 1B, through a convection effect of the aforementioned airflow F, the electronic device 100' of the embodiment has a heat dissipation ability.

In addition, the electronic device 100' of the embodiment further includes an airflow driving element 150, and the airflow driving element 150 is, for example, a fan. In the embodiment, the airflow driving element 150 is disposed within the casing 110 to drive the airflow F through the air port 120. Therefore, in the embodiment, through using the airflow driving element 150, the convection ability of the airflow F can forcibility be enhanced, so that the heat dissipation ability of the electronic device 100' of the embodiment can further be improved. Moreover, in the embodiment, the airflow driving element 150 is, for example, disposed beside the air port 120 at the top of the electronic device 100'. In other embodiment not shown, the airflow driving element 150 can also be disposed beside the air port 120 at the bottom of the electronic device 100', and the invention is not limited thereto. In addition, in one embodiment not shown, the electronic device can also not include the airflow driving element 150, that is, the airflow F can achieve the effect of heat dissipation with a natural convection effect under a condition of not requiring the disposition of the airflow driving element 150.

In view of the above, the electronic device 100' of the embodiment can effectively guide the heat energy generated due to the operation of the display unit 140 having a large size or a high-brightness out of the electronic device 100' with the airflow. Therefore, the display unit 140 in the electronic device 100' of the embodiment can be designed with a large size, and the brightness of the display unit 140 can be designed as high-brightness.

Figure 2D:
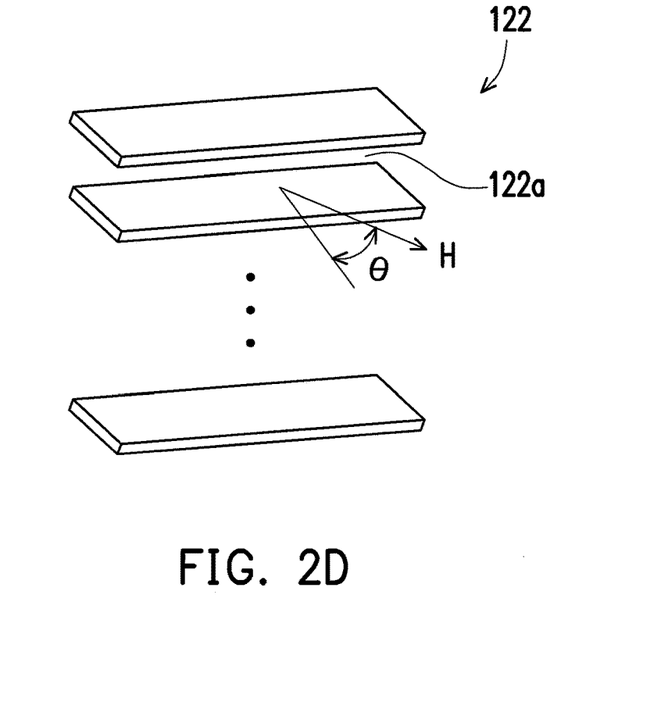
FIG. 2D is a schematic view illustrating a first inclined blocking element of the electronic device in the embodiment of FIG. 2A.

Referring to FIG. 2A and FIG. 2D at the same time, specifically, in the embodiment, the air port 120 includes a first inclined blocking element 122, and the first inclined blocking element 122 can be constituted by a lamellar structure or a honeycomb structure. In the embodiment, the first inclined blocking element 122 has a plurality of first inclined openings 122a, and the first inclined openings 122a are, for example, inclining relative to the horizontal direction H. In detail, in the embodiment, the first inclined openings 122a are, for example, inclining downwards relative to the horizontal direction H, and a range of an inclination angle θ of the first inclined openings 122 in relation to the horizontal direction H is greater than 0 degree and smaller than 90 degrees. In one embodiment, the range the inclination angle θ of the first inclined openings 122 in relation to the horizontal direction H is, for example, from 30 degrees to 75 degrees, but the invention is not limited thereto.

Since the electronic device 100' of the embodiment has the air port 120 and the air port 120 can communicate the inside of the casing 110 with the outside, the electronic device 100' of the embodiment can successfully guide the heat generated due to the operation of the display unit 140 of the electronic module 105 or the sunlight irradiation to the outside with the airflow through the airflow, thereby providing a heat dissipation ability. In addition, each of the first inclined openings 122a of the first inclined blocking element 122 can incline relative to the horizontal direction H, and thus, the water droplets from the outside are blocked by the first inclined blocking element 120. In more detail, the water droplets from the outside as being subjected to an effect of gravity are discharged from the first inclined openings 122a along a surface of the first inclined blocking element 120, so that the water droplets are prevented from entering the electronic device 100' from the outside. Therefore, the electronic device 100' of the embodiment, in addition to having a favorable waterproof ability, further has a favorable heat dissipation ability. It can be known from the above, because the embodiment has both the waterproof and heat dissipation abilities, a phenomenon of display deterioration in the display unit 140 of the electronic device 100' can be significantly reduced, thereby being facilitative in enhancing the lifetimes of the electronic device 100' and its display unit 140.

Referring to FIG. 2A again, in the embodiment, the air port 120 further includes an appearance blocking element 121, a relay blocking element 123 and a filter element 125. Details regarding the aforementioned components will be further described hereinafter.

Figure 2E:
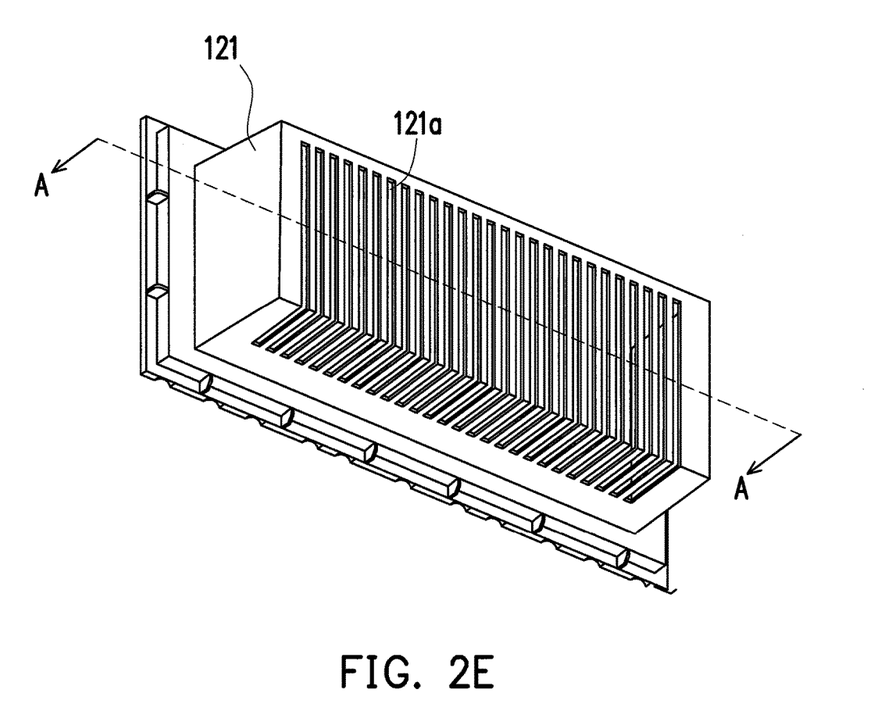
FIG. 2E is a schematic view illustrating an appearance blocking element of the electronic device in the embodiment of FIG. 2A.
Figure 2F:
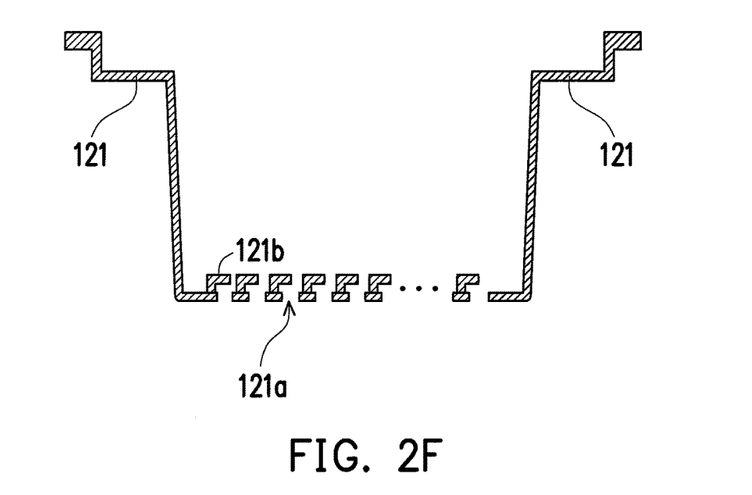
FIG. 2F is a cross-sectional view of the appearance blocking element of FIG. 2E taken along line A-A.

Referring to FIG. 2A and FIG. 2E at the same time, the appearance blocking element 121 is, for example, a plastic piece or a sheet metal part, but the invention is not limited thereto. In the embodiment, the appearance blocking element 121 is disposed at a periphery of the first inclined blocking element 122 in relation to the casing 110 and has a plurality of elongated aperture slots 121a, and the elongated aperture slots 121a are arranged in parallel. Therefore, in the embodiment, with the disposition of the appearance blocking element 121, some of the water droplets can preliminarily be blocked from entering into the electronic device 100'. In addition, referring to FIG. 2E and FIG. 2F, in the embodiment, the appearance blocking element 121 has a plurality of bending portions 121b, and the bending portions 121b are respectively disposed at the elongated aperture slots 121a to interfere with a movement of the airflow. In the embodiment, the bending portions 121b can interfere a movement of the water droplets in the airflow, such that the water droplets in the airflow can be blocked by the bending portions 121b, and thus the water droplets in the airflow as being subjected to the effect of gravity can be discharged to the outside along surfaces of the bending portions 121b, thereby preventing the water droplets from entering the electronic device 100' from the outside.

Figure 2G:
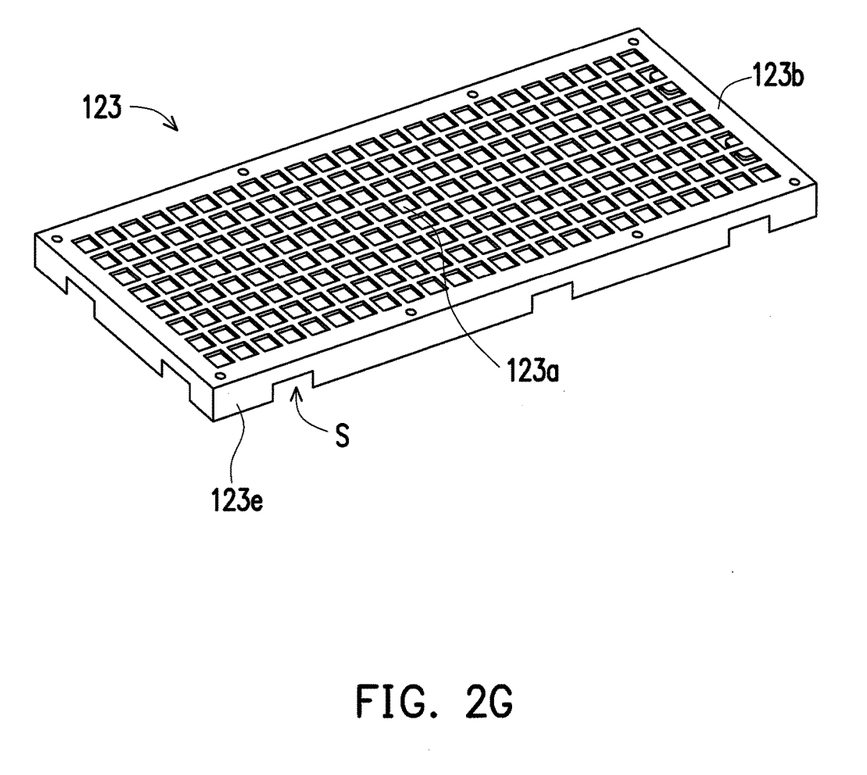
FIG. 2G is a schematic view illustrating a relay blocking element of the electronic device in the embodiment of FIG. 2A.

Referring to FIG. 2A and FIG. 2G at the same time, the relay blocking element 123 is, for example, a plastic piece or a sheet metal part, but the invention is not limited thereto. In the embodiment, the relay blocking element 123 has a main body portion 123b and a plurality of extension portions 123e extended from the main body portion 123b, the main body portion 123b of the relay blocking element 123 has a plurality of square aperture slots 123a, and the square aperture slots 123a can be arranged in an array. In the embodiment, the main body portion 123b and the extension portions 123e of the relay blocking element 123 form an accommodation space S. In the embodiment, the first inclined blocking element 122 is disposed at a periphery of the relay blocking element 123 in relation to the casing 110. It can be known from the above that, in the embodiment, with the disposition of the relay blocking element 123, some of the water droplets can also be blocked from entering into the electronic device 100'.

In view of the above, in the embodiment, the filter element 125 includes a foam, a sponge or other porous material for blocking the water droplets and filtering dirt in the airflow, but the invention is not limited thereto. In the embodiment, the first inclined blocking element 120 is disposed at a periphery of the filter element 125 in relation to the casing 110. Specifically, the filter element 125 of the embodiment can be disposed in the accommodation space S of the relay blocking element 123. In the embodiment, the relay blocking element 123 is configured to fix the filter element 125 at a proper position in the electronic device 100'. In the embodiment, the filter element 125 can block the water droplets and the dirt so as at prevent the water droplets and the dirt from entering into the electronic device 100', thereby providing an additional dustproof function.

Generally, in the embodiment, if an airflow from the outside is to enter into the electronic device 100', then the airflow from the outside will sequentially pass through the appearance blocking element 121, the first inclined blocking element 122, the relay blocking element 123 and the filter element 125. In the embodiment, most of the water droplets are blocked by the first inclined blocking element 120, while the appearance blocking element 121, the relay blocking element 123 and the filter element 125 are used to further enhance the waterproof ability of the electronic device 100'. Therefore, the electronic device 100' of the embodiment can achieve a waterproof level of IP55, and can even achieve a waterproof level of IP68. In addition, the filter element 125 of the electronic device 100' of the embodiment can further provide the additional dustproof function.

Figure 3A:
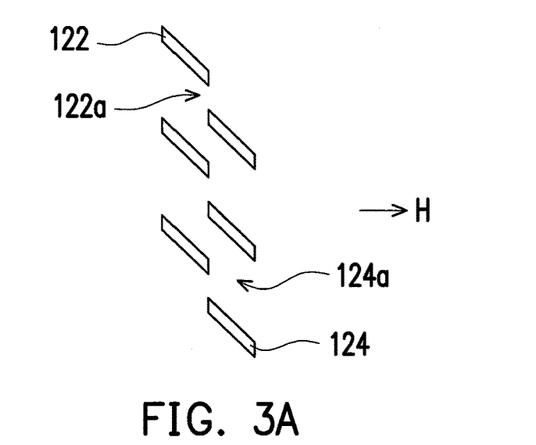
FIG. 3A, FIG. 3B and FIG. 3C are schematic side views illustrating a first inclined blocking element and a second inclined blocking element according to several different embodiments respectively.
Figure 3B:
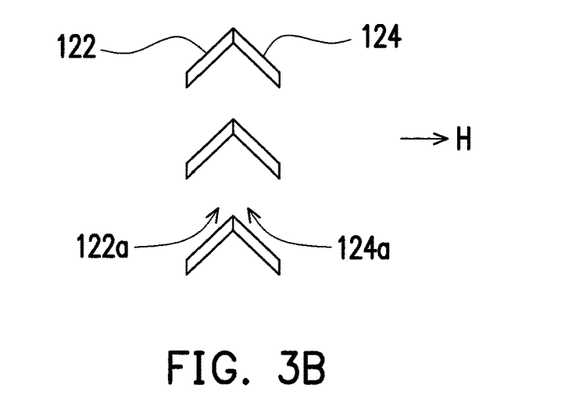
Figure 3C:
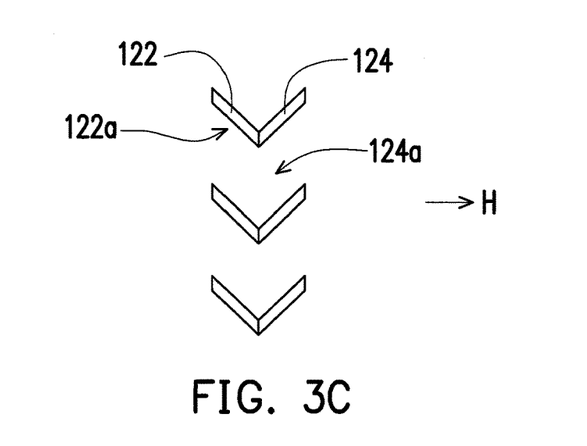

Referring to FIG. 3A through FIG. 3C at the same time, in other embodiment, the air port 120 further includes a second inclined blocking element 124. In the embodiment, the second inclined blocking element 124 overlaps in arrangement with the first inclined blocking element 122 and has a plurality of second inclined openings 124a, wherein the first inclined openings 122a are respectively parallel to or respectively intersect with the second inclined openings 124a.

Referring to FIG. 3A again, in the embodiment, the first inclined blocking element 122 and the second inclined blocking element 124 are separated from each other. In detail, in the embodiment, the first inclined openings 122a of the first inclined blocking element 122 and the second inclined openings 124a of the second inclined blocking element 124 are all inclining downwards relative to the horizontal direction H. In the embodiment, the first inclined openings 122a and the second inclined openings 124a are substantially parallel to and alternate with each other, and the first inclined openings 122a are separated from the second inclined openings 124a.

Referring to FIG. 3B and FIG. 3C at the same time, in the embodiment, the first inclined blocking element 122 and the second inclined blocking element 124 are connected with each other. As shown in the embodiment of FIG. 3B, the first inclined blocking element 122 and the second inclined blocking element 124 are formed into an inverted V-shape. Relatively, from the embodiment shown in FIG. 3C, the first inclined blocking element 122 and the second inclined blocking element 124 are formed into a V-shape.

Referring to FIG. 3B, in detail, in the embodiment, the first inclined openings 122a of the first inclined blocking element 122 incline upwards relative to the horizontal direction H, and the second inclined openings 124a of the second inclined blocking element 124 incline downwards relative to the horizontal direction H. In the embodiment, the first inclined openings 122a and the second inclined openings 124a are intersected with each other. That is to say, in the embodiment, the first inclined openings 122a are connected to the second inclined openings 124a.

Referring to FIG. 3C again, in detail, in the embodiment, the first inclined openings 122a of the first inclined blocking element 122 incline downwards relative to the horizontal direction H, and the second inclined openings 124a of the second inclined blocking element 124 incline upwards relative to the horizontal direction H. In the embodiment, the first inclined openings 122a and the second inclined openings 124a are intersected with each other. That is to say, in the embodiment, the first inclined openings 122a are connected to the second inclined openings 124a.

It can be known from the above embodiment that, the waterproof ability of the electronic device 100' can be enhanced by further disposing the second inclined blocking element 124.

In summary, the above embodiments of the invention may have at least one of the following advantages or effects. Since the electronic device in the above embodiments of the invention has the air port which communicates the inside of the casing to the outside, the heat energy generated due to the operation of the electronic module (or the display unit in the electronic module) or the sunlight irradiation can successfully be guided to the outside through the air port, or cold air from the outside can be brought into the electronic module, and thus a favorable heat dissipation ability is provided. Moreover, in the embodiments of the invention, the first inclined openings of the first inclined blocking element incline relative to the horizontal direction, and thus, when the water droplets enter the electronic device from the outside, the water droplets are blocked by the first inclined blocking element. In the embodiments of the invention, the water droplets as being subjected to the effect of gravity is discharged through the inclined openings along the surface of the inclined blocking element. As such, the electronic device in the above embodiments of the invention, in addition to having a favorable waterproof ability, further has a favorable heat dissipation ability.

In addition, with reference to the electronic device in the above embodiments of the invention, the translucent plate and the display unit can constitute the flow channel and the flow channel can be communicated with the air port, and thus the airflow from the outside can perform a heat exchange with the display unit through the flow channel. With the natural convection effect of the airflow, the electronic device in the above embodiments of the invention has the favorable heat dissipation ability. As such, the display unit of the electronic device in the above embodiments of the invention can be designed as a large size display unit and/or a high-brightness display unit.

Furthermore, the electronic device in the above embodiments of the invention further includes the second inclined blocking element, the appearance blocking element, the relay blocking element and the filter element, and those components are configured to further enhance the waterproof ability of the electronic device. In the embodiments of the invention, the filter element can further provide the additional dustproof function. In addition, the electronic device in the above embodiments of the invention further includes the airflow driving element, and the airflow driving element is configured to drive the airflow through the air port so as to forcibility enhance the convection ability of the airflow, so that the heat dissipation ability of the electronic device is further enhanced. Briefly, the electronic device in the embodiments of the invention not only has the heat dissipation and waterproof abilities but also has the dustproof effect.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An electronic device, comprising:
   an electronic module;
   a casing, accommodating the electronic module; and
   at least one air port, disposed on the casing to communicate the inside of the casing to the outside, the air port comprising:
      a first inclined blocking element, having a plurality of first inclined openings, and the first inclined openings inclining relative to a horizontal direction; and
      an appearance blocking element, disposed at a periphery of the first inclined blocking element in relation to the casing, and having a plurality of elongated aperture slots and a plurality of bending portions, wherein the elongated aperture slots are arranged in parallel, the bending portions are respectively disposed at the elongated aperture slots to interfere with a movement of airflow, and each of the bending portions extends inwards from a side of the corresponding elongated aperture slot and partially blocks an opening area of the corresponding elongated aperture slot, wherein each of the bending portions has a turning portion located in an inner space of the appearance blocking element.

2. The electronic device as recited in claim 1, wherein a range of an inclination angle of the first inclined openings in relation to the horizontal direction is from 30 degrees to 75 degrees.

3. The electronic device as recited in claim 1, wherein the air port further comprising:
   a relay blocking element, having a plurality of square aperture slots, and the square aperture slots being arranged in an array, wherein the first inclined blocking element is disposed at a periphery of the relay blocking element in relation to the casing.

4. The electronic device as recited in claim 1, wherein the air port further comprises a filter element, and the first inclined blocking element is disposed at a periphery of the filter element in relation to the casing.

5. The electronic device as recited in claim 4, wherein the filter element comprises a foam.

6. The electronic device as recited in claim 1, wherein the casing having a flow channel, the flow channel is located inside of the casing, and the air port is connected to the flow channel.

7. The electronic device as recited in claim 1, wherein the casing having a flow channel, the flow channel is located inside of the casing, the number of the at least one air port is a plurality, and the air ports are respectively connected to the flow channel.

8. The electronic device as recited in claim 1, further comprising:
   an airflow driving element, disposed within the casing to drive airflow through the air port.

9. The electronic device as recited in claim 1, further comprising a translucent plate disposed at the casing, wherein the electronic module comprises a display unit disposed within the casing and configured to produce an image, wherein the translucent plate is located on a transmission path of the image.

10. The electronic device as recited in claim 9, wherein the translucent plate and the display unit constitute a flow channel, the flow channel is located inside of the casing, and the flow channel is communicated with the air port.

11. An electronic device, comprising:
   an electronic module;
   a casing, accommodating the electronic module; and
   at least one air port, disposed on the casing to communicate the inside of the casing to the outside, the air port comprising:
      a first inclined blocking element, having a plurality of first inclined openings, and the first inclined openings inclining relative to a horizontal direction; and
      a second inclined blocking element, overlapping in arrangement with the first inclined blocking element and having a plurality of second inclined openings, wherein the first inclined openings and the second inclined openings are substantially parallel to and alternate with each other, and the first inclined openings are separated from the second inclined openings.

\* \* \* \* \*